United States Patent
Haji et al.

(10) Patent No.: US 10,069,042 B2
(45) Date of Patent: Sep. 4, 2018

(54) LIGHT-EMITTING COMPONENTS CONTAINING BODY, MANUFACTURING METHOD OF LIGHT-EMITTING COMPONENTS CONTAINING BODY, COMPONENTS MOUNTING APPARATUS, COMPONENTS MOUNTING METHOD, AND COMPONENTS MOUNTING SYSTEM

(71) Applicant: PANASONIC INTELLECTUAL PROPERTY MANAGEMENT CO., LTD., Osaka (JP)

(72) Inventors: Hiroshi Haji, Osaka (JP); Toshihide Maeda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 229 days.

(21) Appl. No.: 14/885,606

(22) Filed: Oct. 16, 2015

(65) Prior Publication Data

US 2016/0138787 A1    May 19, 2016

(30) Foreign Application Priority Data

Nov. 19, 2014  (JP) ................. 2014-234162
Nov. 19, 2014  (JP) ................. 2014-234163

(51) Int. Cl.
| | |
|---|---|
| *F21V 19/00* | (2006.01) |
| *H01L 33/48* | (2010.01) |
| *H01L 33/00* | (2010.01) |
| *G01R 31/26* | (2014.01) |

(52) U.S. Cl.
CPC ........ *H01L 33/486* (2013.01); *H01L 33/0095* (2013.01); *G01R 31/2635* (2013.01); *H01L 2933/0033* (2013.01)

(58) Field of Classification Search
CPC ............. F21V 19/0015; F21Y 2101/00; F21Y 2115/10; G01R 31/2635; H01L 2933/0033; H01L 33/0095; H01L 33/486; H05K 13/04
See application file for complete search history.

(56) References Cited

U.S. PATENT DOCUMENTS

| | | | | |
|---|---|---|---|---|
| 5,541,416 | A * | 7/1996 | Washizuka | G01N 21/6489 250/458.1 |
| 7,859,614 | B2 * | 12/2010 | Moon | G02F 1/133603 349/69 |
| 8,729,589 | B2 * | 5/2014 | Hussell | F21K 9/60 257/433 |
| 9,219,212 | B2 * | 12/2015 | Ichiza | G02F 1/133615 |
| 9,318,034 | B2 * | 4/2016 | Shin | G09F 13/04 |
| 9,326,337 | B2 * | 4/2016 | Nam | H05B 33/0821 |

(Continued)

FOREIGN PATENT DOCUMENTS

JP    H07-74191 A    3/1995

*Primary Examiner* — Peggy Neils
(74) *Attorney, Agent, or Firm* — Pearne & Gordon LLP

(57) ABSTRACT

A light-emitting components containing body includes plural light-emitting components, a containing body which contains the plural light-emitting components. The containing body contains the plural light-emitting components of the same rank among light-emitting components that are classified into plural ranks according to positional deviations of their light emission portions from their light emission portion reference position.

13 Claims, 9 Drawing Sheets

(56) References Cited

U.S. PATENT DOCUMENTS

| 9,793,247 B2* | 10/2017 | Yuan | H01L 25/0753 |
| 2007/0076412 A1* | 4/2007 | Harbers | F21K 9/00 |
| | | | 362/231 |
| 2011/0110085 A1* | 5/2011 | Tickner | F21S 4/28 |
| | | | 362/249.02 |
| 2013/0236991 A1* | 9/2013 | Nonomura | H01L 33/50 |
| | | | 438/7 |

* cited by examiner

RANK INFORMATION — 5

| COMPONENT NAME | Paaa | |
|---|---|---|
| RANK | RANK CORRECTION VALUES | |
| | X | Y |
| R0 | 0 | 0 |
| R1 | -x1 | -y1 |
| R2 | -x1 | 0 |
| R3 | -x1 | y1 |
| R4 | 0 | y1 |
| R5 | x1 | y1 |
| R6 | x1 | 0 |
| R7 | x1 | -y1 |
| R8 | 0 | -y1 |

LIGHT-EMITTING COMPONENTS CONTAINING BODY, MANUFACTURING METHOD OF LIGHT-EMITTING COMPONENTS CONTAINING BODY, COMPONENTS MOUNTING APPARATUS, COMPONENTS MOUNTING METHOD, AND COMPONENTS MOUNTING SYSTEM

CROSS REFERENCE TO RELATED APPLICATION

This application is based on Japanese Patent Application (No. 2014-234162) filed on Nov. 19, 2014 and Japanese Patent Application (No. 2014-234163) filed on Nov. 19, 2014, the contents of which are incorporated herein by reference.

BACKGROUND

1. Technical Field

The present invention relates to a light-emitting components containing body in which plural light-emitting components are contained in a components containing body, a manufacturing method of such a light-emitting components containing body, a components mounting apparatus, a components mounting method, and a components mounting system.

2. Description of the Related Art

In recent years, illumination boards that employ light-emitting components such as LEDs as light sources have come to be used widely as illumination devices. In illumination boards, plural light-emitting components are mounted in a prescribed arrangement. Illumination boards as final products should satisfy a quality requirement that light-emitting components are arranged with high positional accuracy. In particular, where importance is attached to appearance as in, for example, illumination boards for a vehicular use, it is necessary to arrange the light emission centers of light-emitting components accurately at prescribed positions in their manufacturing processes.

In manufacturing processes of light-emitting components, the positional relationship between the light emission center of the light emission portion that is a functional position of the light-emitting component and its external shape is not kept constant. Light-emitting components as final products have a variation in the positional relationships between actual positions of light emission portions and the light emission portion reference position where the light emission portions should be located. Therefore, to manufacture illumination boards that satisfy the above-mentioned quality requirement by mounting light-emitting components, the light emission portion reference position that is defined on the basis of an external shape or the like cannot be used as it is as a positioning reference of mounting.

Among conventional techniques for mounting, on a board, components having a characteristic that a variation exists in the positional relationships between actual functional positions and the reference position (i.e., the ideal functional position) so that the actual functional positions are arranged correctly is a method in which components are positioned on the basis of results of optically recognizing them in a mounting process (refer to JP-A-7-74191, for example).

In the prior art technique of JP-A-7-74191, in a components mounting process of arranging plural image sensor chips on a long circuit board linearly, first, a chip positioned on an intermediate stage is shot by a camera and a recognition mark position as a functional position is thereby recognized. Then the recognition mark of a chip that has already been mounted on a mounting stage (final chip mounting stage) is recognized. Based on results of these recognition steps, the new chip is mounted so as to have a prescribed positional relationship with the already mounted chip irrespective of differences in their external dimensions.

However, conventional techniques, including the prior art technique of Patent document 1, in which components are positioned on the basis of results of optically recognizing them a mounting process have the following problems. In these conventional techniques, components to be mounted are supplied in mixture irrespective of deviations of their functional positions. In a mounting machine which performs a mounting operation, position correction processing for correcting for deviations is performed on the basis of results of recognition processing for recognizing the components by shooting them and then the components are mounted on a board. As a result, it takes time to perform recognition processing with shooting of components, resulting in reduction in productivity.

As described above, in the conventional techniques, in the case of mounting components having a variation in the positional relationships between their actual light emission portions and their light emission portion reference position, components cannot be supplied in such a manner as to reflect the variation of their positional deviations. This makes it difficult to mount components with sufficient quality and increased productivity.

SUMMARY

An object of the present invention is to provide a light-emitting components containing body and a manufacturing method of a light-emitting components containing body that make it possible to supply light-emitting components in such a manner as to be divided into groups by classifying them into plural ranks according to positional deviations of their light-emitting portions even if they have a variation in positional deviations between their light emission portions and their light emission portion reference position.

Another object of the invention is to provide a components mounting apparatus, a components mounting method, and a components mounting system that can increase productivity while securing sufficient quality even in the case of dealing with light-emitting components having a variation in positional deviations between their light emission portions and their light emission portion reference position.

The invention provides a light-emitting components containing body including: plural light-emitting components; and a components containing body which contains the plural light-emitting components, wherein the components containing body contains the plural light-emitting components of the same rank among light-emitting components that are classified into plural ranks according to positional deviations of their light emission portions from their light emission portion reference position.

The invention also provides a manufacturing method of a light-emitting components containing body, the manufacturing method including: detecting a positional deviation of a light emission portion of each of light-emitting components from their light emission portion reference position; and classifying the light-emitting components into plural ranks and causing plural light-emitting components of the same rank to be contained in the same light-emitting components containing body.

The invention makes it possible to supply light-emitting components in such a manner as to be divided into groups by classifying them into plural ranks according to positional deviations of their light-emitting portions even if they have a variation in positional deviations between their light emission portions and their light emission portion reference position.

The invention also makes it possible to increase productivity while securing sufficient quality even in the case of dealing with light-emitting components having a variation in positional deviations between their light emission portions and their light emission portion reference position.

DETAILED DESCRIPTION OF THE EXEMPLARY EMBODIMENTS

An embodiment of the present invention will be hereinafter described with reference to the drawings. First, referring to FIGS. 1A and 1B, a description will be made of the structure of a light-emitting component 1 that is a contained component of a light-emitting components containing body 18 according to the embodiment and is to be mounted by a components mounting apparatus according to the embodiment.

Figure 1A:
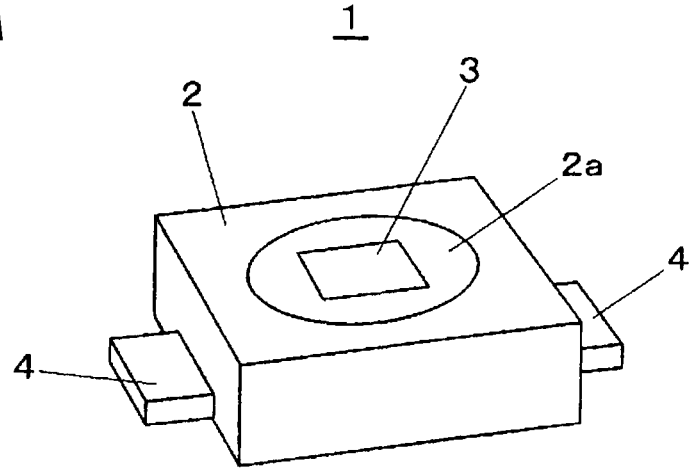
FIGS. 1A and 1B illustrate structures of a light-emitting component used in an embodiment of the present invention.

As shown in FIG. 1A, the light-emitting component 1 has a main body 2 whose top surface is formed with a pocket 2a. A light emission portion 3 which is formed by covering the top surface of an LED (light source) with a phosphor is formed in the pocket 2a. Connection terminals 4 extend from the two respective side ends of the main body 2. When the terminals 4 are connected to a power source, the light emission portion 3 emits light upward.

Figure 1B:
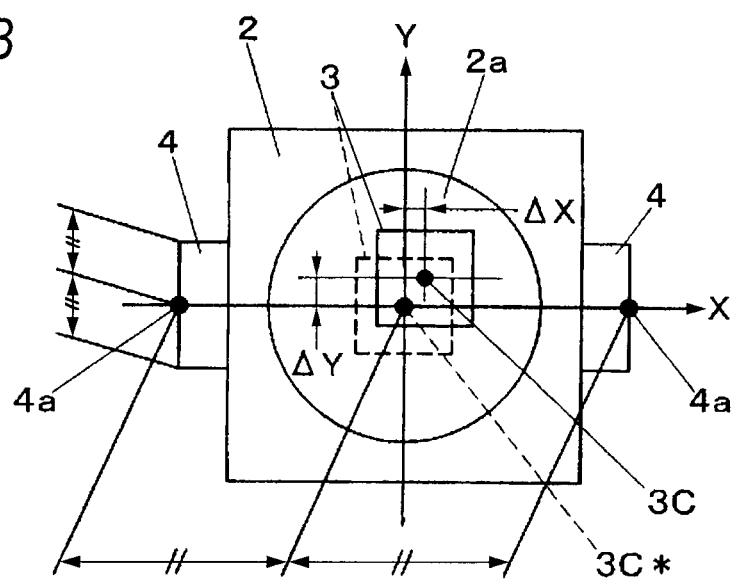

In FIG. 1B which shows the top surface of the light-emitting component 1, the center of the straight line segment connecting the two edge centers 4a of the edges of the terminals 4 is a light emission portion reference position 3C* of the light-emitting component 1. The light emission portion reference position 3C* is a position of the light emission center of the light emission portion 3 (indicated by a broken line) of an ideal light-emitting component 1 that has been manufactured accurately so as to conform exactly to a design specification and hence has no dimensional errors. However, in actual light-emitting components 1, the position of the light emission portion 3 with respect to the main body 2 is not necessarily managed strictly, as a result of which usually a light emission center 3C of the light emission portion 3 (indicated by a solid line) does not coincide with, that is, deviates from, the light emission portion reference position 3C*.

And this positional deviation varies from one light-emitting component 1 to another. Symbols $\Delta X$ and $\Delta Y$ represent deviation components (positive or negative) in the X direction which is parallel with the line connecting the edge centers of the terminals 4 and the Y direction which is perpendicular to the X direction. That is, in the embodiment, a components mounting operation is performed on light-emitting components 1 having a variation in the positional relationships between the light emission portions 3 and the light emission portion reference position 3C*. Unlike in the embodiment in which the light emission center of the light emission portion 3 of the ideal light-emitting component 1 is employed as the light emission portion reference position 3C*, another position that can be defined as a reference position may be selected as a reference position as appropriate.

When an illumination board is formed by mounting plural such light-emitting components 1, the light emission portions 3 whose positions deviate from one light-emitting component 1 to another lower the appearance quality of the illumination board. If a method were employed in which to prevent such a quality failure positional deviations are detected and corrected in a components mounting process, image recognition processing would need to be performed to detect a positional deviation for each light-emitting component 1, resulting reduction in productivity.

To solve this problem, in the embodiment, as described below, deviations are classified into ranks according to their variation tendency and light-emitting components 1 of the same rank are handled together, whereby quality and productivity reduction due to the variation is prevented.

Figures 2A, 2B:
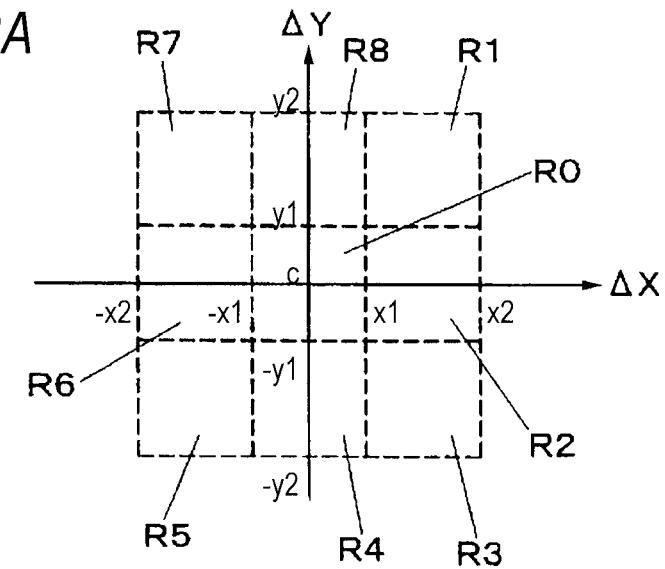
FIGS. 2A and 2B illustrate rank information indicating positional deviations of light emission portions of light-emitting components used in the embodiment from their light emission portion reference position.

FIGS. 2A and 2B show how light-emitting components 1 are classified into ranks. FIG. 2A is a ranking map for ranking plural light-emitting components 1 using their $\Delta X$ and $\Delta Y$ values (see FIG. 1B). Deviation ranks are defined as grid-like sections that are formed by dividing a plane defined by the orthogonal coordinate system having $\Delta X$ and $\Delta Y$ as the horizontal and vertical axes by dividing lines defined by horizontal coordinate values $\pm x1$ and $\pm x2$ and vertical coordinate values $\pm y1$ and $\pm y2$, respectively.

Rank R0 is a rank in which $\Delta X$ and $\Delta Y$ of the light emission center 3C (see FIG. 1B) of the light-emitting component 1 are within the ranges of $\pm x1$ and $\pm y1$, respectively. Actual light-emitting components 1 whose light emission centers 3C are closest to the light emission portion reference position 3C* and that are hence highest in accuracy are classified as rank R0. Rank R1 is a rank in which $\Delta X$ and $\Delta Y$ of the light emission center 3C are within the ranges of x1 to x2 and y1 to y2, respectively. Actual light-emitting components 1 whose light emission centers 3C deviate from the light emission portion reference position 3C* to a large extent in the positive direction in each of $\Delta X$ and $\Delta Y$ are classified as rank R1. Rank R2 is a rank in which $\Delta X$ and $\Delta Y$ of the light emission center 3C are within the ranges of x1 to x2 and ±y1, respectively. Actual light-emitting components 1 whose light emission centers 3C deviate from the light emission portion reference position 3C* to a small extent in ΔY but to a large extent in the positive direction in ΔX are classified as rank R2.

Rank R3 is a rank in which ΔX and ΔY of the light emission center 3C are within the ranges of x1 to x2 and −y1 to −y2, respectively. Actual light-emitting components 1 whose light emission centers 3C deviate from the light emission portion reference position 3C* to a large extent in the positive direction in ΔX and in the negative direction in ΔY are classified as rank R3. Rank R4 is a rank in which ΔX and ΔY of the light emission center 3C are within the ranges of ±x1 and −y1 to −y2, respectively. Actual light-emitting components 1 whose light emission centers 3C deviate from the light emission portion reference position 3C* to a small extent in ΔX but to a large extent in the negative direction in ΔY are classified as rank R4. Rank R5 is a rank in which ΔX and ΔY of the light emission center 3C are within the ranges of −x1 to −x2 and −y1 to −y2, respectively. Actual light-emitting components 1 whose light emission centers 3C deviate from the light emission portion reference position 3C* to a large extent in the negative direction in each of ΔX and ΔY are classified as rank R5.

Rank R6 is a rank in which ΔX and ΔY of the light emission center 3C are within the ranges of −x1 to −x2 and ±y1, respectively. Actual light-emitting components 1 whose light emission centers 3C deviate from the light emission portion reference position 3C* to a small extent in ΔY but to a large extent in the negative direction in ΔX are classified as rank R6. Rank R7 is a rank in which ΔX and ΔY of the light emission center 3C are within the ranges of −x1 to −x2 and y1 to y2, respectively. Actual light-emitting components 1 whose light emission centers 3C deviate from the light emission portion reference position 3C* to a large extent in the negative direction in ΔX and in the positive direction in ΔY are classified as rank R7. Rank R8 is a rank in which ΔX and ΔY of the light emission center 3C are within the ranges of ±x1 and y1 to y2, respectively. Actual light-emitting components 1 whose light emission centers 3C deviate from the light emission portion reference position 3C* to a small extent in ΔX but to a large extent in the positive direction in ΔY are classified as rank R8.

The values x1, x2, y1, and y2 which determine the sizes of the sections of the above ranking map define an allowable range and a marginal range for positional deviations of light emission centers 3C from the light emission portion reference position 3C*. More specifically, if a light-emitting component 1 is classified as rank R0, that is, if its positional deviation components ΔX and ΔY are in the ranges of ±x1 and ±y1, it can be mounted as it is with a judgment that its light emission center 3C substantially coincides with the light emission portion reference position 3C* (i.e., the positional deviation is within the allowable range). If a light-emitting component 1 is classified as one of ranks R1 to R8, that is, if its positional deviation component ΔX is in the range of x1 to x2 or −x1 to −x2 and ΔY is in the range of ±y2 or ΔY is in the range of y1 to y2 or −y1 to −y2 and ΔX is in the range of ±x2 (i.e., the positional deviation is within the marginal range), it is mounted while being corrected for a deviation component(s) that is outside the allowable range. If a light-emitting component 1 is not classified as any of ranks R0 to R8, that is, its positional deviation components ΔX and ΔY are out of the ranges of ±x2 and ±y2, it is eliminated as a defective component.

The rank information 5 shown in FIG. 2B is information relating to the above-described ranks 7 of the light-emitting component 1 that a supplier of the light-emitting component 1 supplies to a user of a components mounting apparatus. That is, the rank information 5 includes a component name 6 (in this example, "Paaa") which is identification information for identification of a kind etc. of the light-emitting component 1 and a table that defines a corresponding relationship between the rank 7 and the rank correction values 8 for the light-emitting component 1. The table includes the ranks 7 and sets of rank correction values 8 that are set for the respective ranks 7 as positional deviation correction values that are necessary at the time of component mounting. Each set of rank correction values 8 correspond to the associated rank 7 in the respective directions of correction to be made at the time of component mounting, that is, in the X direction and the Y direction. In the example of FIGS. 2A and 2B, by performing a positional deviation correction using rank correction values 8, the positional deviation components of the light emission center 3C of a light-emitting component 1 from the light emission portion reference position 3C* can fall within the ranges of ±(x2−x1) and ±(y2−y1) in a state that it is mounted on a board.

More specifically, for rank R0, since a light-emitting component 1 itself is high in accuracy, the rank correction values 8 in the X direction and the Y direction are both set at "0." For rank R1, since the positional deviation components ΔX and ΔY are both large in the positive direction, the rank correction values 8 in the X direction and the Y direction are set at negative values "−x1" and "−y1," respectively. For rank R2, since the positional deviation component ΔY is small but ΔX is large in the positive direction, the rank correction values 8 in the X direction and the Y direction are set at a negative value "−x1" and "0," respectively.

For rank R3, since the positional deviation component ΔX is large in the positive direction and ΔY is large in the negative direction, the rank correction values 8 in the X direction and the Y direction are set at a negative value "−x1" and a positive value "y1," respectively. For rank R4, since the positional deviation component ΔX is small but ΔY is large in the negative direction, the rank correction values 8 in the X direction and the Y direction are set at "0" and a positive value "y1," respectively. For rank R5, since the positional deviation components ΔX and ΔY are both large in the negative direction, the rank correction values 8 in the X direction and the Y direction are set at positive values "x1" and "y1," respectively.

For rank R6, since the positional deviation component ΔY is small but ΔX is large in the negative direction, the rank correction values 8 in the X direction and the Y direction are set at a positive value "x1" and "0," respectively. For rank R7, since the positional deviation component ΔX is large in the negative direction and ΔY is large in the positive direction, the rank correction values 8 in the X direction and the Y direction are set at a positive value "x1" and a negative value "−y1," respectively. For rank R8, since the positional deviation component ΔX is small but ΔY is large in the positive direction, the rank correction values 8 in the X direction and the Y direction are set at "0" and a negative value "−y1," respectively.

Although in the above rank information 5 the set of rank correction values for each rank 7 are set for the center of the corresponding square section, it may be set for an average position of the deviated light emission centers 3C of actual light-emitting components 1 classified as the rank 7.

Figure 3:
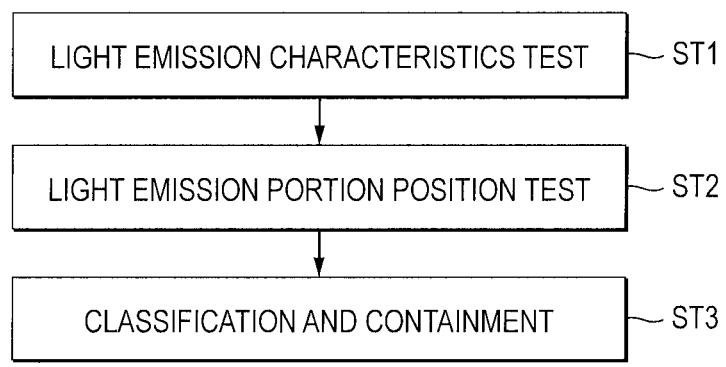
FIG. 3 is a flowchart of the whole of a manufacturing method of a light-emitting components containing body according to the embodiment.
Figure 4:
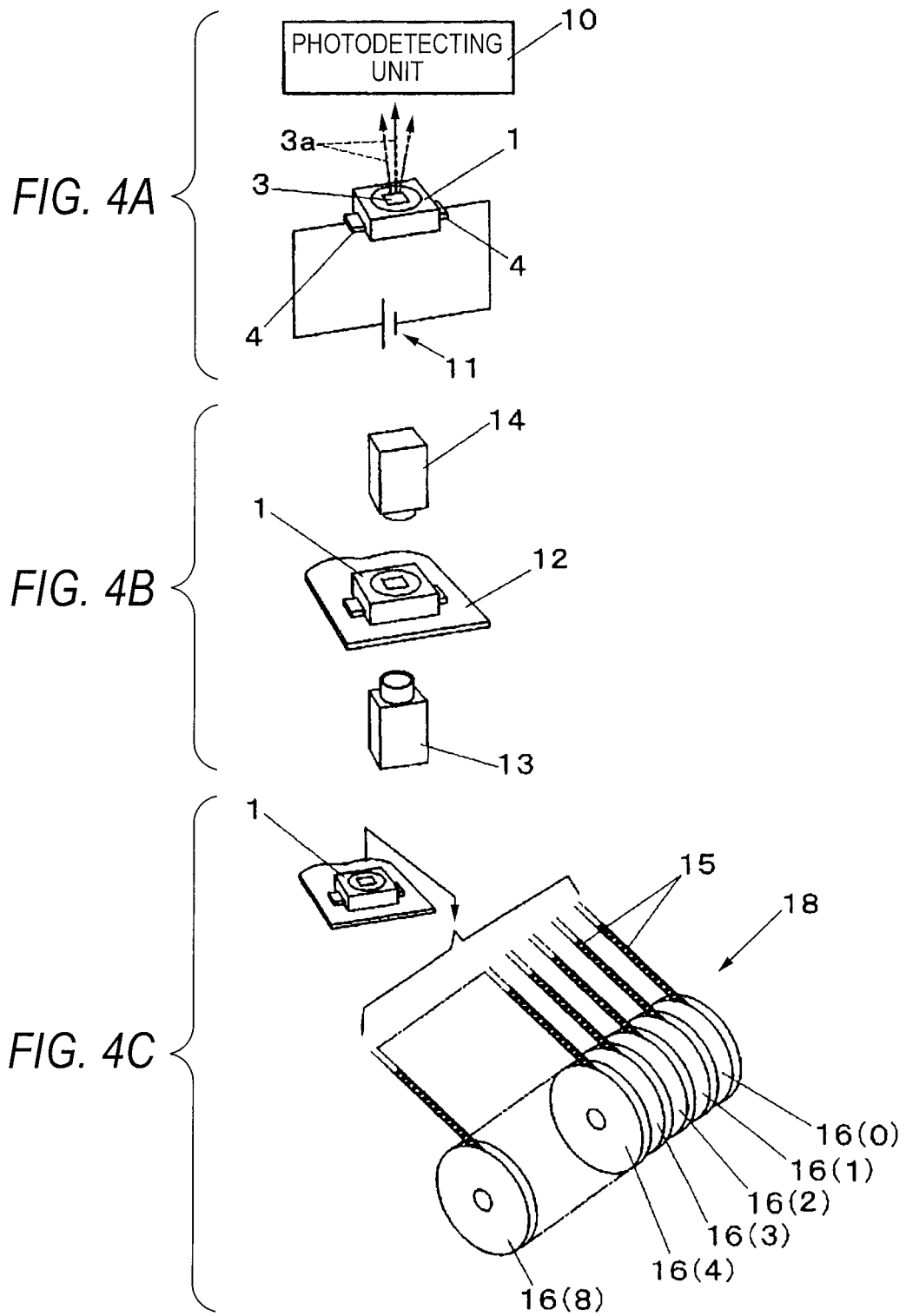
FIGS. 4A to 4C illustrate a specific process of the manufacturing method of a light-emitting components containing body according to the embodiment.

Next, a manufacturing method of a light-emitting components containing body that contains plural light-emitting components 1 will be described with reference to FIGS. 3-5.

In this manufacturing method, plural light-emitting components 1 that have been classified as the same rank 7 according to the ranking map shown in FIG. 2A are contained in each containing body. FIG. 3 is a flowchart of the whole of this manufacturing method of a light-emitting components containing body.

First, at step ST1, a light-emitting component 1 to be contained is made a subject of a light emission characteristics test. More specifically, the light-emitting component 1 is sent to a light emission characteristics testing instrument, where as shown in FIG. 4A a power source 11 is connected to the terminals 4 and operation power is supplied to the light-emitting component 1. The light emission portion 3 emits illumination light 3a upward, which is received by a photodetecting unit 10. As a result, light emission characteristics such as a color tone and a diffusion characteristic, that is, prescribed items that determine quality of the light-emitting component 1, are tested.

Then, at step ST2, a light emission portion position test is performed on the light-emitting component 1 that has been subjected to the light emission characteristics test. More specifically, the light-emitting component 1 is sent to a light emission portion position testing instrument, where as shown in FIG. 4B it is placed on a transparent stage 12. A lower camera 13 for component position detection is disposed under the transparent stage 12 with its imaging surface up. An upper camera 14 for light emission portion position detection is disposed over the transparent stage 12 with its imaging surface down.

The light-emitting component 1 is shot by the lower camera 13 from below through the transparent stage 12, whereby an external shape of the light-emitting component 1 (see FIG. 1B) is recognized. As a result, the light emission portion reference position 3C* which is defined as the center of the line segment connecting the edge centers 4a of the two terminals 4 can be determined. Furthermore, the light emission center 3C which is the center of the light emission portion 3 is recognized by shooting the light-emitting component 1 by the upper camera 14 from above. As a result, ΔX and ΔY shown in FIG. 1B are determined and how the light emission center 3C of the light emission portion 3 of the light-emitting component 1 deviates from the light emission portion reference position 3C* is recognized (light emission portion position testing step).

Subsequently, at step ST3, classification and containment are performed on the light-emitting component 1 that has been subjected to the light emission portion position test. More specifically, the light-emitting component 1 is classified as one of the ranks 7 (ranks R0 to R8) of the ranking map shown in FIG. 2A according to the ΔX and ΔY obtained by the light emission portion position test. As shown in FIG. 4C, the classified light-emitting component 1 is then set in a components containing tape 15 (light-emitting components 1 of the same rank 7 are set in each components containing tape 15).

In this example, reels 16(0)-16(8) are prepared for respective ranks R0 to R8. Plural light-emitting component 1 of the same rank 7 are set in the same components containing tape 15 that is wound on the associated reel 16 (classification and containment step). Each reel 16 with a components containing tape 15 wound thereon constitutes a light-emitting components containing body 18 which contains plural light-emitting components 1. That is, in the embodiment, light-emitting components 1 are classified into the plural ranks 7 according to positional deviations of their light emission portions 3 from their light emission portion reference position 3C* and plural light-emitting component 1 of the same rank 7 are contained in each components containing tape 15.

Figure 5:
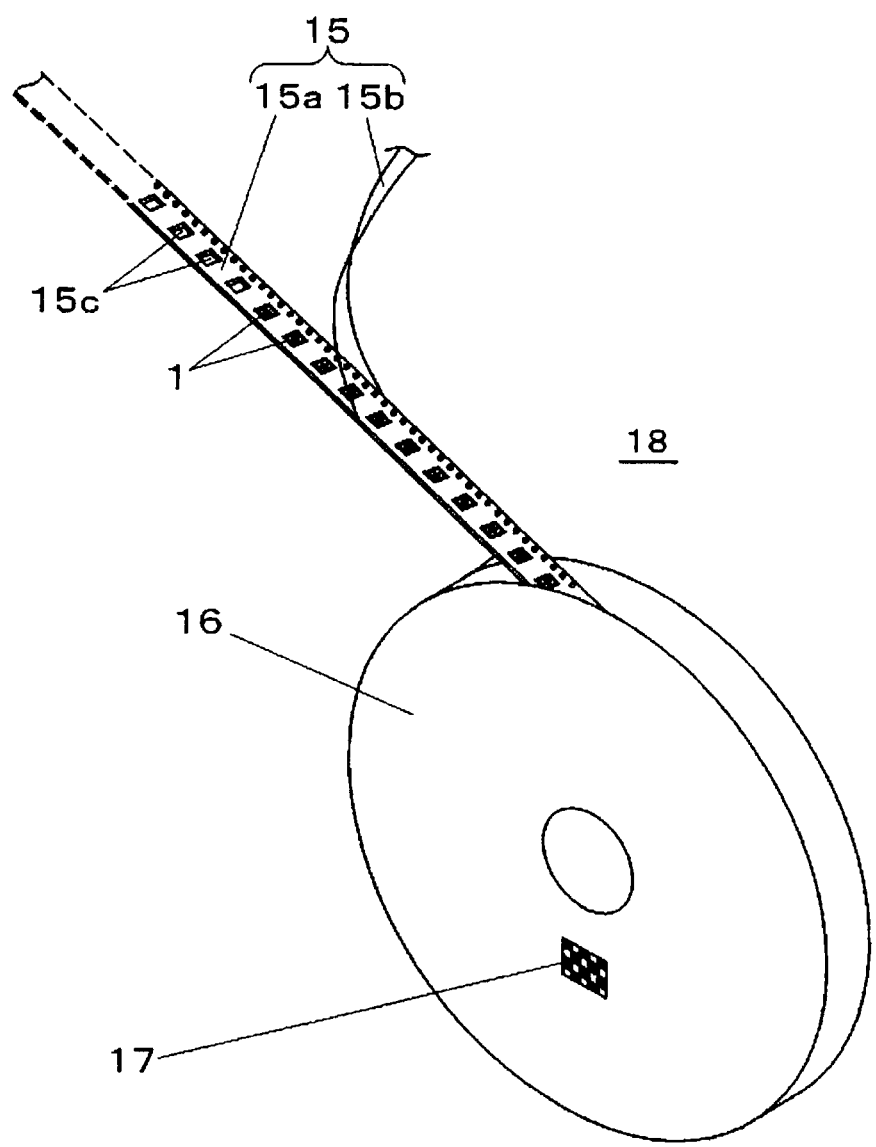
FIG. 5 illustrates the structure of a light-emitting components containing body according to the embodiment.

FIG. 5 shows a components containing tape 15 and a reel 16 which are used for the classification and containing step shown in FIG. 4C. The components containing tape 15 is composed of a base tape 15a and a cover film 15b. The base tape 15a is formed with housing pockets 15c in which to house respective light-emitting components 1. After light-emitting components 1 have been housed in the respective housing pockets 15c, the cover film 15b is adhered to the top surface of the base tape 15a so as to cover the housing pockets 15c. The components containing tape 15 in which the light-emitting components 1 are housed in the housing pockets 15c and its top surface is covered with the cover film 15b is wound on and housed in the reel 16.

That is, each light-emitting components containing body 18 is composed of the components containing tape 15 which is formed with the housing pockets 15c in which respective light-emitting components 1 are housed and the reel 16 on and in which the components containing tape 15 is wound and housed. In the above classification and containment step, light-emitting components 1 are contained in the components containing tape 15 which is formed with the housing pockets 15c in which to house the respective light-emitting components 1.

A two-dimensional bar code 17 which is an information recording medium and in which information relating to the light-emitting components 1 contained in the components containing tape 15 is recorded is attached to each reel 16. The two-dimensional bar code 17 contains at least the component name 6 of the light-emitting components 1 contained and information indicating the rank 7 of the light-emitting components 1, that is, one of ranks R0 to R8 (see the rank information 5 shown in FIG. 2B). Thus, the light-emitting components containing body 18 has the two-dimensional bar code 17 which contains the information for identification of the above-mentioned rank 7.

The "information for identification of a rank 7" means information that enables identification of a rank 7 of the light-emitting components 1 concerned. This information may be provided as characters or a symbol such as one of R0 to R8 or a one-dimensional bar code when implemented as a label. When each light-emitting components containing body 18 is used being set in a components mounting apparatus 20 shown in FIG. 6, a worker reads the two-dimensional bar code 17 with a reading unit such as a bar code reader. As a result, the rank 7 of the light-emitting components 1 contained in the light-emitting components containing body 18 can be recognized.

The two-dimensional bar code 17 is adhered to the reel 16 after the above-described classification and containment step, whereby the light-emitting components containing body 18 is provided with the information recording medium in which the information for identification of the rank (see FIG. 2B) is recorded (component information attaching step).

Figure 9A:
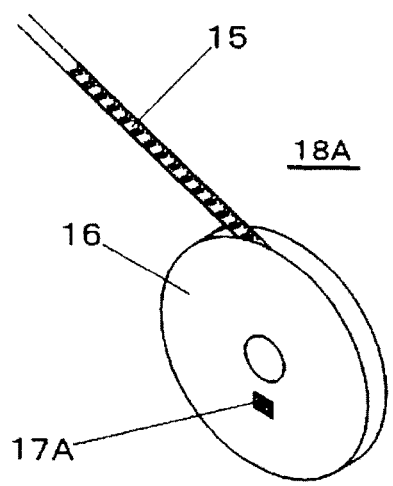
FIG. 9A shows another light-emitting components containing body.

Whereas in this example only the component name 6 of the light-emitting components 1 and the information for identification of their rank 7 are recorded in the two-dimensional bar code 17, as shown in FIG. 9A a two-dimensional bar code 17A that additionally contains a set of rank correction value 8 corresponding to the rank 7 may be adhered to the reel 16. In this case, in the component information attaching step, the two-dimensional bar code 17A (information recording medium) in which the rank correction values 8 corresponding to the rank 7 are also recorded is attached to a light-emitting components containing body 18A.

Next, the components mounting apparatus 20 for picking up light-emitting components 1 from light-emitting components containing bodies 18 each containing plural light-emitting components 1 and mounting them on a board 23 by means of a mounting head 31 will be described with reference to FIG. 6. In this example, light-emitting components containing bodies 18 as shown in FIG. 5 are used and each light-emitting components containing body 18 contains plural light-emitting components 1 of the same rank among light-emitting components 1 that have been classified into plural ranks according to positional deviations of their light emission portions 3 from their light emission portion reference position 3C*.

Figure 6:
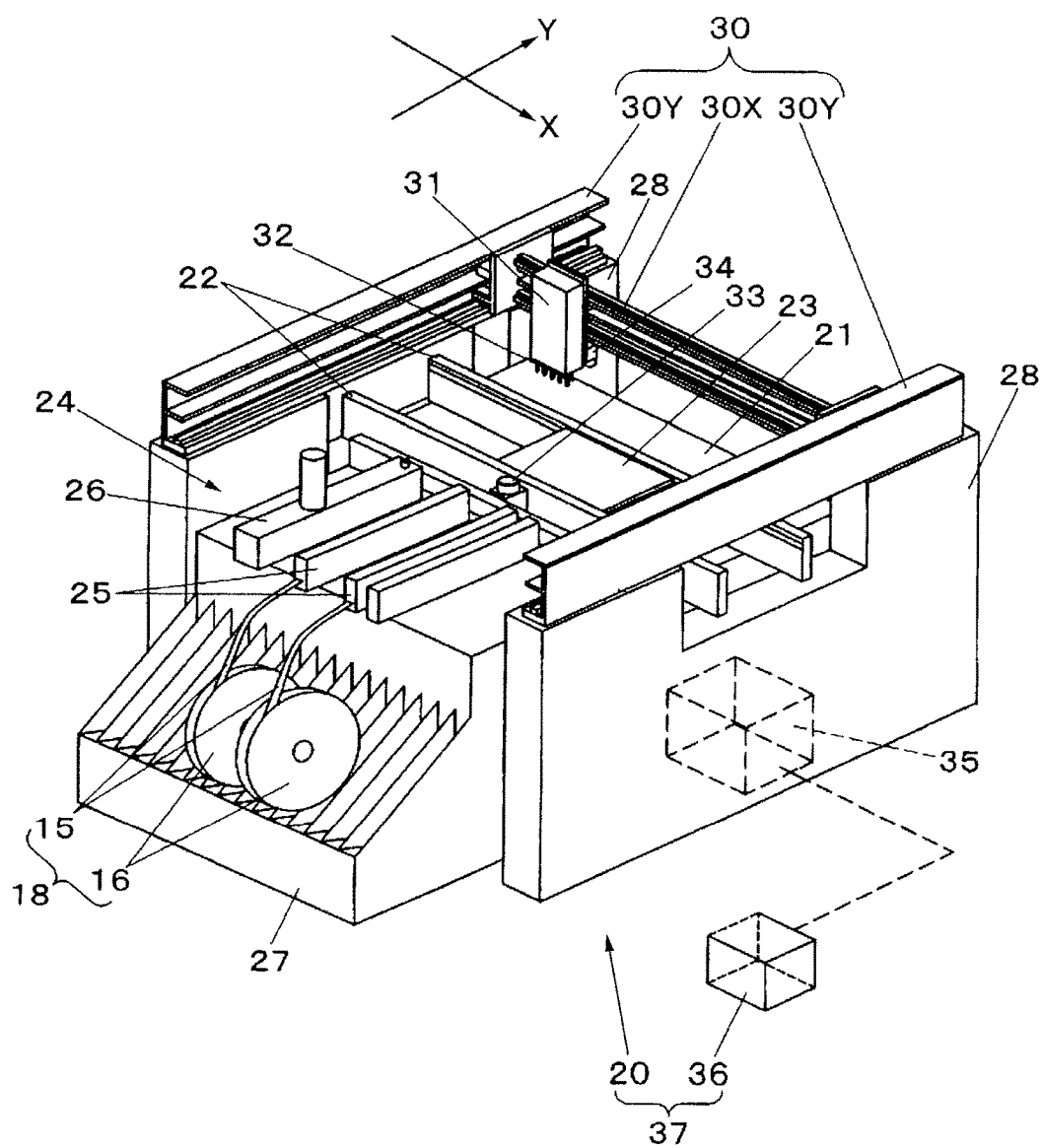
FIG. 6 illustrates the configurations of a components mounting apparatus and a components mounting system according to the embodiment.

As shown in FIG. 6, a board conveying mechanism 22 is disposed on the top surface of a base stage 21 so as to extend in the X direction (board conveying direction). A board 23 to be mounted with light-emitting components 1 is passed to the board conveying mechanism 22 from an upstream machine, and is positioned and held at a position where it is to be subjected to operation of a components mounting mechanism (described later). A components supply device 24 is disposed beside the board conveying mechanism 22, and plural components supply units 25 and an adhesive applying mechanism 26 are attached to the components supply device 24.

A components supply cart 27 is set in the components supply device 24, and holds plural reels 16 of respective light-emitting components containing body 18. Each components supply unit 25 supplies light-emitting components 1 to a component pick-up position of the components mounting mechanism by pitch-feeding them. The adhesive applying mechanism 26 supplies temporary fixing adhesive to be applied to the bottom surfaces of light-emitting components 1 that have been picked up from the components supply units 25.

A pair of Y-axis mechanisms 30Y are disposed on the top surfaces of frames 28 which are erected so as to be attached to the two respective ends, in the X direction, of the base stage 21, and an X-axis mechanism 30X is connected to the Y-axis mechanisms 30Y so as to be movable in the Y direction. The mounting head 31 having component absorption nozzles 32 at the bottom end is attached to the X-axis mechanism 30X so as to be movable in the X direction. The X-axis mechanism 30X and the Y-axis mechanisms 30Y constitute a mounting head moving mechanism 30. The mounting head 31 is moved between the components supply device 24 and the board 23 being held by the board conveying mechanism 22 by driving the mounting head moving mechanism 30.

In the thus-configured components mounting apparatus 20, the mounting head 31 picks up light-emitting components 1 from the components supply units 25 and mounts them on the board 23. In doing so, the mounting head 31 that holds the light-emitting components 1 by the nozzles 32 accesses the adhesive applying mechanism 26, whereby adhesive that is discharged from the adhesive applying mechanism 26 is applied to the bottom surfaces of the light-emitting components 1. The mounting head moving mechanism 30 and the mounting head 31 constitute the components mounting mechanism for mounting, on the board 23, light-emitting components 1 that have been picked up from light-emitting components containing bodies 18.

A component shooting camera 33 is disposed with its imaging surface up on the moving path of the mounting head 31 extending between the components supply device 24 and the board conveying mechanism 22. The component shooting camera 33 shoots each light-emitting component 1 from below as the mounting head 31 holding the light-emitting component 1 passes over the component shooting camera 33. The mounting head 31 is provided with a board shooting camera 34 which is moved together with it. As the mounting head 31 is moved over the board 23, the board shooting camera 34 shoots a recognition mark and components mounting positions of the board 23.

Figure 7A:
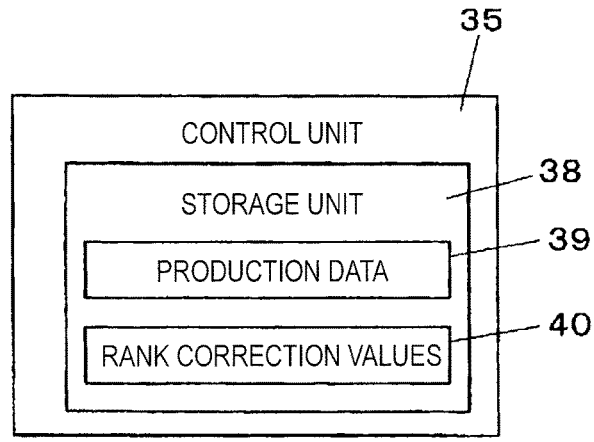
FIG. 7A shows data to be stored in a storage unit.

The components mounting apparatus 20 is equipped with a control unit 35 which performs processing of controlling the above-described mechanisms, units, etc. and has a storage unit 38 (see FIG. 7A) for storing data to be used for the above control processing. As shown in FIG. 7A, the storage unit 38 is stored with production data 39 and sets of rank correction values 40. The production data 39 are data that prescribe, for each type of a board 23, information necessary for manufacture such as components mounting positions on the board 23 and component data.

The rank correction values 40 are the same data as the sets of rank correction values 8 which are determined for the respective ranks 7 in the rank information 5 shown in FIG. 2B. That is, the storage unit 38 is stored with the sets of correction values (rank correction values 40) that correspond to the respective ranks 7 of the light-emitting components 1 contained in the light-emitting components containing bodies 18. In the embodiment, the sets of rank correction values in the rank information 5 supplied from a supplier (see FIG. 2B) are referred to as "rank correction values 8" and the sets of rank correction values that are registered for manufacture in the storage unit 38 of the components mounting apparatus 20 are referred to as "rank correction values 40". Thus, discrimination is made between these two kinds of sets of rank correction values.

The control unit 35 controls the board conveying mechanism 22, the mounting head moving mechanism 30, and the mounting head 31 on the basis of the production data 39, whereby a components mounting operation of mounting, on the board 23, light-emitting components 1 that are picked up from the light-emitting components containing bodies 18 is performed. In this operation, the set of rank correction values 40 corresponding to the rank 7 of each subject light-emitting component 1 is read from the storage unit 38 and the control unit 35 causes the light-emitting component 1 to be mounted on the board 23 while being position-corrected on the basis of the set of rank correction values 40.

The control unit 35 recognizes shooting results of the component shooting camera 33 and the board shooting camera 34 by means of its image recognition function, whereby positional deviations of light-emitting components 1 in the state of being held by the mounting head 31 are detected and components mounting positions on the board 23 are recognized. As such, the component shooting camera 33 and the control units 35 serve as a component positions recognizing unit for detecting positions of light-emitting components 1 by recognizing the light-emitting components 1 as picked up by the mounting head 31.

In a components mounting operation, the control unit 35 performs control processing of correcting components mounting positions of the mounting head 31 on the basis of results of the above detection of positional deviations. That is, the control unit 35 serves as a mounting control unit for mounting light-emitting components 1 while positioning their light emission portions 3 at prescribed positions on the board 23 by controlling the mounting head moving mechanism 30 (for moving the mounting head 31) using the rank correction values 40 stored in the storage unit 38 and the positions of the light-emitting components 1 detected by the above component positions recognition.

The control unit 35 is connected to a host system 36. Prior to a start of manufacture, data including production data 39 for a production subject board type and sets of rank correction values 40 are transmitted from the host system 36 to the control unit 35 and stored in the storage unit 38. In the above configuration, the components mounting apparatus 20 and the host system 36 constitute a components mounting system 37 for picking up light-emitting components 1 from the light-emitting components containing bodies 18 that are set in the components supply device 24 and each contain plural light-emitting components 1 by means of the mounting head 31 and mounting them on the board 23.

Each of the light-emitting components containing bodies 18 to be handled by the components mounting system 37 contains plural light-emitting components 1 of the same rank 7 among light-emitting components 1 that have been classified into plural ranks 7 according to positional deviations of their light emission portions 3 from their light emission portion reference position 3C*. And a two-dimensional bar code 17 as an information recording medium in which information for identification of a rank 7 is recorded is attached to each light-emitting components containing body 18.

The components mounting system 37 is equipped with a reading unit such as a bar code reader or a memory reader (to be manipulated by a worker) for reading the information for identification of a rank 7 from the two-dimensional bar code 17 of each light-emitting components containing body 18, as well as the host system 36 and the components mounting apparatus 20. The host system 36 serves as a correction values registering unit which stores rank information 5 indicating a corresponding relationship between ranks 7 and sets of rank correction values 8 for correction of positional deviations (see FIGS. 2A and 2B), determines sets of rank correction values to be used in mounting light-emitting components 1 on the basis of pieces of information for identification of ranks 7 that have been read by the reading unit, and registers, in the components mounting apparatus 20, the determined sets of rank correction values 8 as sets of rank correction values 40 for manufacture.

The components mounting apparatus 20 has a function of picking up a light-emitting component 1 from each light-emitting components containing body 18 by means of the mounting head 31 and mounting the light-emitting component 1 on the board 23 while positioning its light emission portion 3 at a prescribed position. In positioning the light emission portions 3 of the light-emitting component 1 at the prescribed position by means of the mounting head 31, the components mounting apparatus 20 uses the corresponding set of rank correction values 40 for manufacture that have been registered in the storage unit 38 of the control unit 35 by the host system 36.

Next, a components supply operation assisting process (first example) that is executed in the components mounting system 37 after setting of each light-emitting components containing body 18 in the components mounting apparatus 20 and before supply of light-emitting components 1 will be described with reference to FIG. 7B. This components supply operation assisting process is to register a set of rank correction values 40 for each light-emitting components containing body 18 to be used in the storage unit 38 of the components mounting apparatus 20 prior to a start of manufacture so that the set of rank correction values 40 can be used for a components mounting operation, and is executed by a processing function of the host system 36. Where this components supply operation assisting process (first example) is employed, rank information 5 as shown in FIG. 2B is stored in advance in the host system 36 which is part of the components mounting system 37.

First, at step ST11, the scheduled use of each components supply unit 25 for a components mounting operation is announced. More specifically, among the plural components supply units 25 that are attached to the components supply device 24 of the components mounting apparatus 20, an announcement lamp of each of components supply units 25 to be used for a components mounting operation is lit to notify a worker of its scheduled use. Thus notified, at step ST12 the worker sets a components containing tape 15 in each of those components supply units 25 and detects the contents of the two-dimensional bar code 17 of the reel 16 in which the components containing tape 15 is housed, using a bar code reader (reading unit). As a result, the component name 6 and the rank 7 (see FIG. 2B) of the light-emitting components 1 contained in the light-emitting components containing body 18 are read and reading results are transmitted to the host system 36.

At step ST13, it is judged whether or not coincidence is found in the component name. More specifically, the host system 36 judges coincidence/non-coincidence by comparing the read-out component name with a component name that is prescribed in production data 39 in advance as corresponding to an attachment address of the components supply unit 25. If non-coincidence is found because of, for example, attachment of an erroneous components containing tape to the components supply unit 25, at step ST14 the non-coincidence is announced using an announcement unit such as a display panel or an announcement lamp of the components mounting apparatus 20.

If coincidence is found at step ST13, rank correction values are read at step ST15. More specifically, the host system 36 reads the rank correction values 8 that have been stored in advance as part of the rank information 5 for the light-emitting components 1 concerned. At step ST16, the rank correction values 8 are registered. More specifically, the read-out rank correction values 8 are registered in the storage unit 38 of the control unit 35 as rank correction values 40 to be used in mounting the light-emitting components 1 concerned. When the light-emitting components 1 concerned are mounted thereafter, the control unit 35 controls the components mounting using the rank correction values 40 stored in the storage unit 38.

Next, referring to FIG. 8, a description will be made of a components mounting method of picking up light-emitting components 1 from light-emitting components containing bodies 18 each of which is set in the components supply device 24 of the components mounting apparatus 20 and contains plural light-emitting components 1 and mounting them on a board 23, by means of the mounting head 31. As described above, each light-emitting components containing body 18 contains plural light-emitting components 1 of the same rank 7. A storing step of storing sets of rank correction values 8 corresponding to respective ranks 7 of the light-emitting components 1 contained in the light-emitting components containing bodies 18 has already been executed prior to a start of manufacture, as a result of which the sets of rank correction values 40 for the light-emitting components containing bodies 18 to be used are registered in the storage unit 38.

Upon a start of manufacture, a board 23 is carried in and held at step ST21. More specifically, a board 23 is carried in to the board conveying mechanism 22 from the upstream side, conveyed to the mounting operation position, and positioned and held there. At step ST22, the board 23 is recognized. More specifically, the board shooting camera 34 is moved to over the board 23 together with the mounting head 31 and shoots components mounting positions on the board 23. At step ST23, recognition processing is performed on shooting results by the recognition function of the control unit 35 and sets of mounting coordinates correction values are calculated for the respective mounting positions.

At step ST24, light-emitting components 1 are picked up. More specifically, the mounting head 31 is moved to the components supply device 24 and light-emitting components 1 are picked up from light-emitting components containing bodies 18 via components supply units 25 by absorbing and holding them by means of the nozzles 32 (components picking-up step). At ST 25, the mounting head 31 that holds the light-emitting components 1 by means of the nozzles 32 is moved to over the component shooting camera 33 to recognize the light-emitting components 1. More specifically, the light-emitting components 1 that have been picked up by the mounting head 31 are recognized to detect positions of the light-emitting components 1 (component positions recognizing step). As a result, at step ST26, positional deviations (component positional deviations) of the light-emitting components 1 in the state of being held by the respective nozzles 32 are obtained.

At step ST27, nozzle target positions are calculated. More specifically, target positions to which the mounting head 31 that holds the light-emitting components 1 by means of the nozzles 32 is to be moved for mounting of the light-emitting components 1 are calculated on the basis of the sets of mounting coordinates correction values calculated at step ST23 and the components positional deviations obtained at step ST26. At this step, the sets of rank correction values 40 that were registered in the storage unit 36 at step ST16 shown in FIG. 7B are used and corrections for positioning the light emission portions 3 of the light-emitting components 1 at prescribed positions are also made.

At step 28, adhesive is applied. More specifically, the mounting head 31 that holds the light-emitting components 1 by means of the nozzles 32 is caused to access the adhesive applying mechanism 26 and adhesive for temporary fixing is applied to the bottom surfaces of the respective light-emitting components 1 at prescribed application positions. The application of adhesive is necessary only in the case of soldering the light-emitting components 1 to the board 23. That is, in the case of solder joining, the light-emitting components 1 may be displaced from their target mounting positions due to self-alignment action during a reflow process. The light-emitting components 1 are fixed tentatively in advance to prevent positional deviations from occurring in the above manner. Instead of applying adhesive to the light-emitting components 1, adhesive may be applied in advance to the board 23 at the mounting positions. In the case of using a joining material other than solder, such as a conductive adhesive, it is not necessary to apply adhesive for temporary fixing.

At step ST29 (light-emitting components mounting step), the light-emitting components 1 are mounted on the board 23 while positioning their light emission portions 3 at the prescribed positions of the board 23 by controlling the mounting head moving mechanism 30 (for moving the mounting head 31) using the sets of rank correction values 40 stored in the storage unit 38 and the positions of the light-emitting components 1 detected at the component positions recognizing step (ST25). At step ST29, the mounting head 31 is position-controlled on the basis of the nozzle target positions calculated at step ST27, whereby the light emission portions 3 of the light-emitting components 1 are positioned at the prescribed positions (target mounting positions) of the board 23.

At step ST30, it is judged whether the components mounting operation for the board 23 has been completed. If the judgment result is negative, the process returns to step ST24. If it is judged at step ST30 that the components mounting operation has been completed, at step S31 the holding of the board 23 is canceled and the board 23 is carried out. More specifically, the holding of the board 23 by the board conveying mechanism 22 is canceled and the board 23 for which the components mounting operation has been completed is carried out to the downstream side by the board conveying mechanism 22. Thus, the process of mounting the light-emitting components 1 on the single board 23 is finished.

Figure 7B:
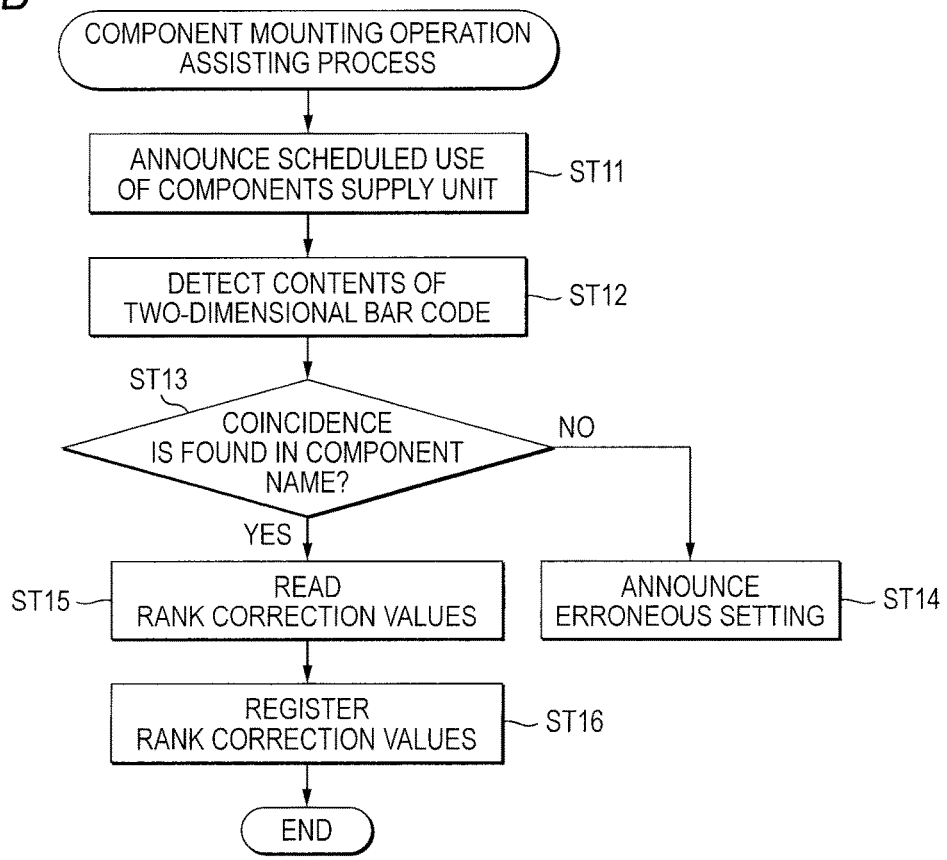
FIG. 7B is a flowchart of a components supply operation assisting process (first example) which is executed in the components mounting system according to the embodiment.
Figure 8:
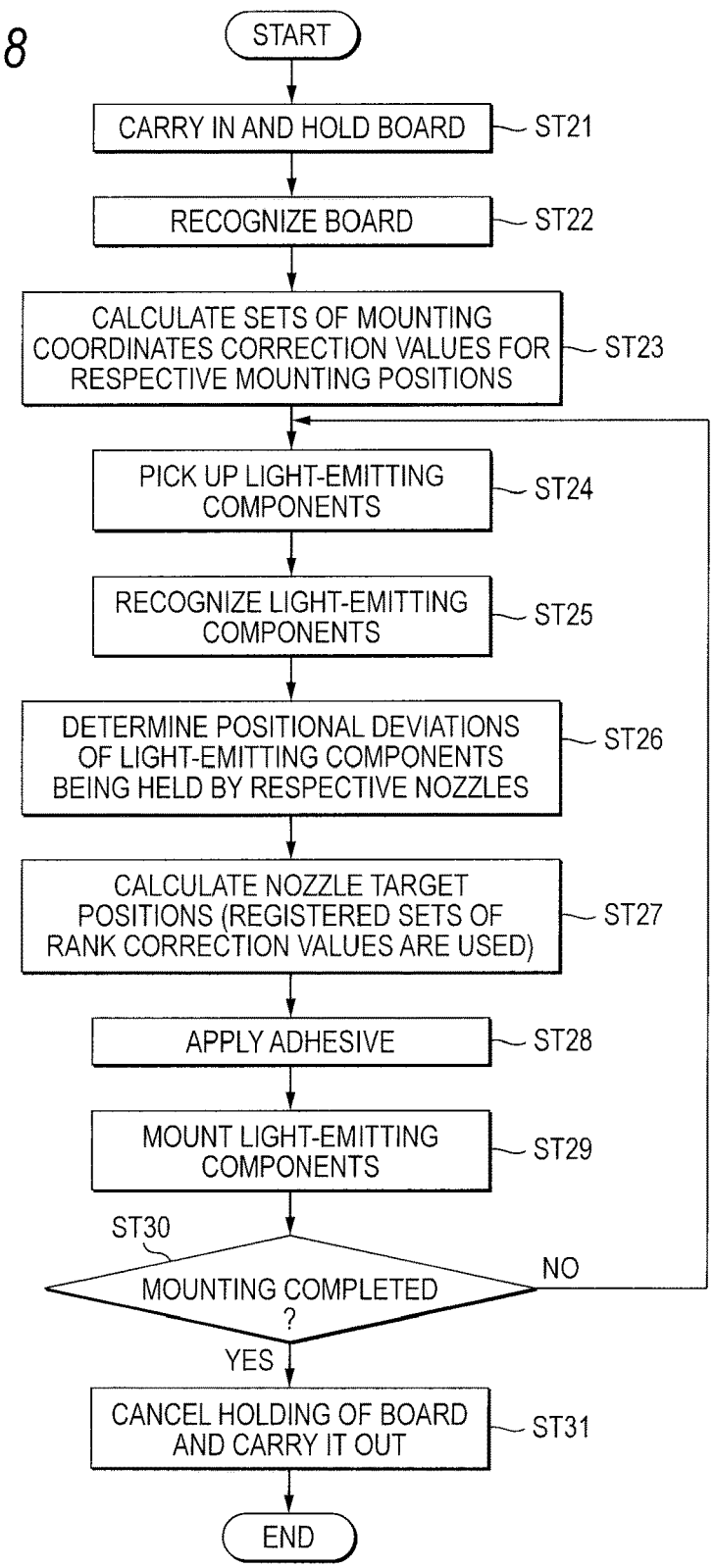
FIG. 8 is a flowchart showing the procedure of a components mounting method according to the embodiment

The process of FIG. 8 is such as to use sets of rank correction values 40 registered by the components supply operation assisting process (first example) shown in FIG. 7B. That is, sets of rank correction values 40 to be used in the light-emitting components mounting step (ST29) are determined on the basis of the rank information 5 indicating the corresponding relationship between the ranks 7 and the sets of rank correction values 8 (see FIG. 2B) and pieces of information for identification of the ranks 7 that are read from the two-dimensional bar codes 17. At the rank correction values registering step (ST16), the determined rank correction values 40 are stored in the storage unit 38.

Figure 9B:
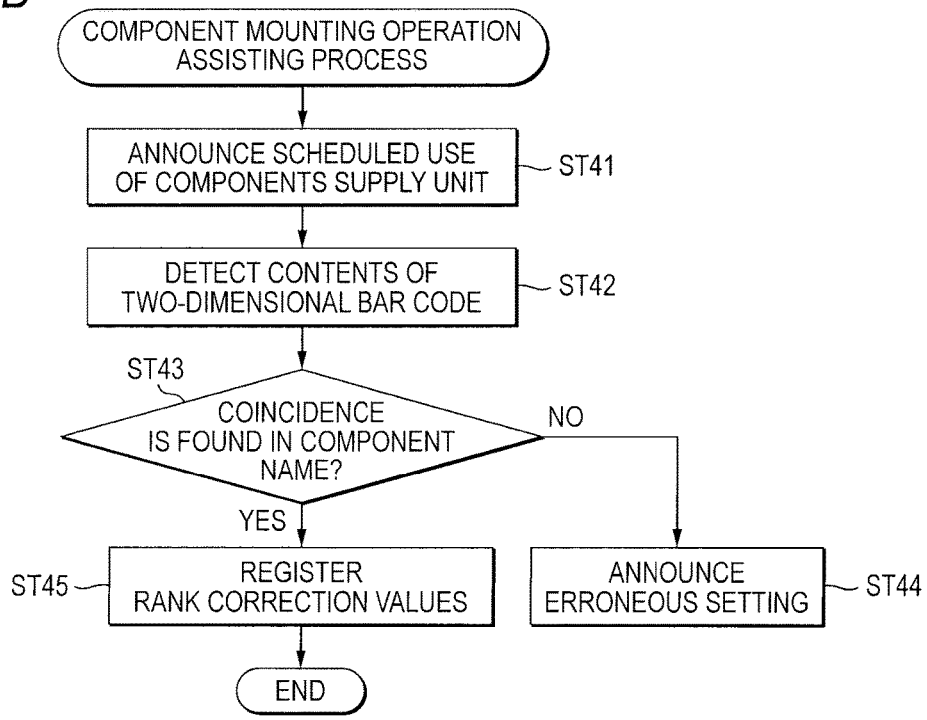
FIG. 9B is a flowchart of another components supply operation assisting process (second example) which is executed in the components mounting system according to the embodiment.

Alternatively, light-emitting components 1 may be mounted using sets of rank correction values 40 that have been registered by another components supply operation assisting process (second example) shown in FIG. 9B. FIG. 9A shows a light-emitting components containing body 18A which is used in this case. A two-dimensional bar code 17A as an information recording medium is attached to each light-emitting components containing body 18A. Since a component name 6 and a set of rank correction values 8 (see FIG. 2B) are both recorded in the two-dimensional bar code 17A, a set of rank correction values 8 to be registered in the storage unit 38 can be obtained directly by reading the two-dimensional bar code 17A. In this case, it is not necessary to store rank information 5 as shown in FIG. 2B in the host system 36 in advance.

This components supply operation assisting process (second example) will be described below with reference to FIG. 9B. Like the above-described components supply operation assisting process (first example), this components supply operation assisting process (second example) is to register a set of rank correction values 40 for each light-emitting components containing body 18 to be used in the storage unit 38 of the components mounting apparatus 20 prior to a start of manufacture so that the set of rank correction values 40 can be used for a components mounting operation, and is executed by the processing function of the host system 36.

First, at step ST41, the scheduled use of each components supply unit 25 for a components mounting operation is announced. More specifically, among the plural components supply units 25 that are attached to the components supply device 24 of the components mounting apparatus 20, an announcement lamp of each of components supply units 25 to be used for a components mounting operation is lit to notify a worker of its scheduled use. Thus notified, at step ST42 the worker sets a components containing tape 15 in each of those components supply units 25 and detects the contents of the two-dimensional bar code 17 of the reel 16 in which the components containing tape 15 is housed, using the bar code reader (reading unit). As a result, the component name 6 and the rank correction values 8 (see FIG. 2B) of the light-emitting components 1 contained in the light-emitting components containing body 18A are read and reading results are transmitted to the host system 36.

At step ST43, it is judged whether or not coincidence is found in the component name. More specifically, the host system 36 judges coincidence/non-coincidence by comparing the read-out component name with a component name that is prescribed in production data 39 in advance as corresponding to an attachment address of the components supply unit 25. If non-coincidence is found, at step ST44 the non-coincidence is announced using the announcement unit such as the display panel or the announcement lamp of the components mounting apparatus 20.

If coincidence is found at step ST43, the rank correction values 8 are registered at step S45. More specifically, as in the above-described components supply operation assisting process (first example), the host system 36 registers the read-out rank correction values 8 in the storage unit 38 of the control unit 35 as rank correction values 40 to be used in mounting the light-emitting components 1 concerned.

In this manner, in this components supply operation assisting process (second example), rank correction values 8 are read from the two-dimensional bar code 17A (information recording medium) of each light-emitting components containing body 18A and the read-out correction values 8 are registered in the storage unit 38 as rank correction values 40 at the rank correction values registering step (ST45) of storing rank correction values 40 in the components mounting apparatus 20. The subsequent operation (i.e., components mounting operation) is the same as in the case of the above-described components supply operation assisting process (first example); that is, the control unit 35 controls the components mounting operation using the sets of rank correction values 40 registered in the storage unit 38.

In the components mounting system 37 that employs the components supply operation assisting process (second example) shown in FIG. 9B, each light-emitting components containing body 18A contains plural light-emitting components 1 of the same rank 7 among light-emitting components 1 that have been classified into the plural ranks 7 according to positional deviations of their light emission portions 3 from their light emission portion reference position 3C* and is equipped with a two-dimensional bar code 17A (information recording medium) in which rank correction values 8 for correction of positional deviations are recorded.

The components mounting system 37 is equipped with a reading unit such as a bar code reader or a memory reader for reading the rank correction values 8 from the two-dimensional bar code 17A of each light-emitting components containing body 18A, the host system 36 (correction values registering unit) for storing sets of rank correction values 8 read by the reading unit in the storage unit 38 of the components mounting apparatus 20 and thereby registering them as sets of rank correction values 40 for manufacture, and the components mounting apparatus 20 for picking up light-emitting components 1 from light-emitting components containing bodies 18A by means of the mounting head 31 and mounting them on the board 23 while positioning their light emission portions 3 at prescribed positions. In positioning the light emission portions 3 of the light-emitting components 1 at the prescribed positions by means of the mounting head 31, the components mounting apparatus 20 uses the sets of rank correction values 40 that have been registered in the storage unit 38 by the host system 36.

As described above, in the light-emitting components containing body 18 or 18A and the manufacturing method of a light-emitting components containing body 18 or 18A according to the embodiment, each light-emitting components containing body 18 or 18A in which the components containing tape 15 that contains plural light-emitting components 1 is wound on and housed in the reel 16 is manufactured in the following manner. After its light emission characteristics are tested, each light-emitting component 1 that is placed on the transparent stage 12 is shot from above and below and resulting images are subjected to recognition processing, whereby a positional deviation of its light emission portion 3 from its light emission portion reference position 3C* is detected. Light-emitting components 1 are classified into plural ranks according to positional deviations of their light emission portions 3, and plural light-emitting components 1 of the same rank are set in the same light-emitting components containing body 18 or 18A.

As a result, even where light-emitting components 1 are used in which positional deviations of their light emission portions 3 from the light emission portion reference position 3C* have a variation, the light-emitting components 1 can be supplied in such a manner as to be divided into groups by classifying them into plural ranks according to the positional deviations of their light emission portions 3. This makes it possible to solve the problems of the prior art technique in which components having appreciably different positional deviations are supplied in mixture, that is, irrespective of the positional deviations.

In the components mounting apparatus, the components mounting method, and the components mounting system according to the embodiment, before a components mounting operation of mounting, on a board 23, light-emitting components 1 picked up from each light-emitting components containing body 18 containing plural light-emitting components 1 of the same rank 7 among light-emitting components 1 that have been classified into plural ranks 7 according to positional deviations of their light emission portions 3 from their light emission portion reference position 3C*, information relating to the rank 7 of the light-emitting components 1 contained in each light-emitting components containing body 18 is read from the information recording medium of the light-emitting components containing body 18 and correction values to be used in mounting the light-emitting components 1 are determined on the basis of the read-out information and registered in the control unit 35 of the components mounting apparatus 20. When each light-emitting component 1 is mounted on the board 23 by the mounting head 31, its light emission portion 3 is positioned at a prescribed position of the board 23 using the registered correction values.

This solves the problems that occur in a components mounting operation because mounting subject components having appreciably different positional deviations are supplied in mixture, that is, irrespective of the positional deviations. That is, it is not necessary to detect, in the components mounting apparatus 20, a positional deviation of each light-emitting component 1 on the basis of a result of recognition processing of recognizing the light emission portion 3 by shooting the light-emitting component 1. Therefore, even where light-emitting components 1 that have a variation in positional deviations of their light emission portions 3 from their light emission portion reference position 3C* are to be handled, no time needs to be taken to perform shooting and recognition processing to detect such positional deviations, making it possible to increase productivity while securing sufficient quality.

Providing the advantage that light-emitting components can be supplied in such a manner as to be divided into groups by classifying them into plural ranks according to positional deviations of their light-emitting portions even if they have a variation in positional deviations between their light emission portions and their light emission portion reference position, the invention is useful in a field of manufacturing illumination boards by mounting plural light-emitting components.

What is claimed is:

1. A light-emitting components containing body comprising:
    plural light-emitting components; and
    plural components containing bodies which contain the plural light-emitting components,
    wherein each of the plural components containing bodies contains the plural light-emitting components of the same rank among light-emitting components that are classified into plural ranks according to positional deviations of their light emission portions from their light emission portion reference position, which is defined based on an external shape of the light-emitting component,
    wherein each of the plural components containing bodies is divided into plural sections, and a center of each of the plural light-emitting components of the same rank is located in the same section among the divided plural sections.

2. The light-emitting components containing body according to claim 1, further comprising:
    an information recording medium in which information for identification of the rank is recorded.

3. The light-emitting components containing body according to claim 1, further comprising:
    an information recording medium in which a correction value corresponding to the rank is recorded.

4. The light-emitting components containing body according to claim 1, wherein the components containing body comprises:
    a carrier tape that is formed with component pockets that house the light-emitting components respectively; and
    a tape reel on and in which the carrier tape is wound and housed.

5. A manufacturing method of a light-emitting components containing body including plural components containing bodies which contain plural light-emitting components, the manufacturing method comprising:
    detecting a positional deviation of a light emission portion of each of light-emitting components from their light emission portion reference position; and
    classifying the light-emitting components according to the positional deviation into plural ranks and causing plural light-emitting components of the same rank to be contained in a same light-emitting components containing body among the plural components containing bodies,
    wherein each of the plural components containing bodies is divided into plural sections, and a center of each of the plural light-emitting components of the same rank is located in the same section among the divided plural sections.

6. The manufacturing method according to claim 5, further comprising:
    attaching an information recording medium in which information for identification of the rank is recorded to the light-emitting components containing body.

7. The manufacturing method according to claim 5, further comprising:
    attaching an information recording medium in which a correction value corresponding to the rank is recorded to the light-emitting components containing body.

8. The manufacturing method according to claim 5, wherein in the classification and containment process of the light-emitting components, the light-emitting components are housed in respective component pockets that are formed in a carrier tape.

9. The light-emitting components containing body according to claim 1,
    wherein the each of the plural components containing bodies contains the plural light-emitting components in different rank.

10. The light-emitting components containing body according to claim 1,
    wherein the light-emitting component comprises a main body and a pair of connection terminals extending from two side ends of the main body,
    a center of a straight line connecting the two edge centers of edges of the pair of the connection terminals is a light emission portion reference position of the light-emitting component,
    the light emission portion includes a light emission center, and
    the positional deviation is a deviation of the light emission center from the light emission portion reference position.

11. The light-emitting components containing body according to claim 10,
    wherein when X direction is defined as a parallel direction to the line connecting the edge centers of the pair of the connection terminals, and Y direction is defined as a perpendicular direction to the X direction,
    the rank of the light-emitting component is defined based on a positional deviation in the X direction and a positional deviation in the Y direction.

12. The manufacturing method according to claim 5,
    wherein the each of the plural components containing bodies contains the plural light-emitting components in different rank in the classifying step.

13. The manufacturing method according to claim 5,
    wherein the light-emitting component includes a main body and a pair of connection terminals extending from two side ends of the main body,
    a center of a straight line connecting the two edge centers of edges of the pair of the terminals is a light emission portion reference position of the light-emitting component,
    the light emission portion includes a light emission center,
    a deviation of the light emission center from the light emission portion reference position is detected in the detecting step.

* * * * *